(12) United States Patent
Tsubokawa

(10) Patent No.: US 10,415,577 B2
(45) Date of Patent: Sep. 17, 2019

(54) DEPOSITION SUBSTANCE MONITORING DEVICE AND VACUUM PUMP

(71) Applicant: SHIMADZU CORPORATION, Kyoto (JP)

(72) Inventor: Tetsuya Tsubokawa, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 178 days.

(21) Appl. No.: 15/694,815

(22) Filed: Sep. 3, 2017

(65) Prior Publication Data

US 2018/0066669 A1 Mar. 8, 2018

(30) Foreign Application Priority Data

Sep. 6, 2016 (JP) .................................. 2016-173828

(51) Int. Cl.
*F04D 27/00* (2006.01)
*F04D 17/12* (2006.01)
(Continued)

(52) U.S. Cl.
CPC ........... *F04D 27/001* (2013.01); *F04D 17/12* (2013.01); *F04D 17/168* (2013.01); *F04D 19/04* (2013.01);
(Continued)

(58) Field of Classification Search
CPC ........ F04B 51/00; F04B 49/065; F04B 49/06; F04B 17/03; F04B 2201/0802; F04B 49/10; F04B 13/00; F04B 19/22; F04B 2205/09; F04B 23/021; F04B 43/02; F04B 47/00; F04B 49/08; F04B 49/103; F04B 49/106; F04B 49/22; F04B 53/10; F04B 15/02; F04B 2201/0201; F04B 2201/0202; F04B 2201/0405; F04B 2201/0601; F04B 2201/1211; F04B 2203/0208; F04B 2203/0209; F04B 2205/04; F04B 2205/05; F04B 2205/13; F04B 2207/043; F04B 2207/701; F04B 2207/702; F04B 23/02; F04B 23/04; F04B 23/06; F04B 33/005; F04B 35/01; F04B 35/04; F04B 37/14;
(Continued)

(56) References Cited

U.S. PATENT DOCUMENTS

2013/0071258 A1 3/2013 Enomoto
2015/0114101 A1 4/2015 Enomoto

FOREIGN PATENT DOCUMENTS

CN 102812254 A 12/2012
WO WO 2011/145444 11/2011
WO WO 2013/161399 12/2015

OTHER PUBLICATIONS

Office Action for corresponding Chinese Patent App. No. 201710415007.3, dated Jan. 17, 2019, with English translation.

*Primary Examiner* — Andre J Allen
(74) *Attorney, Agent, or Firm* — Renner, Otto, Boisselle & Sklar, LLP

(57) ABSTRACT

A deposition substance monitoring device of a vacuum pump for rotatably driving a rotor by a motor to exhaust gas, comprises: a state determination section configured to determine whether or not the vacuum pump is in a predetermined exhaust state; and a deposition amount determination section configured to receive a deposition amount indicator for an amount of a deposition substance in the pump to determine as excessive deposition when the deposition amount indicator in the predetermined exhaust state is equal to or greater than an acceptable deposition threshold.

6 Claims, 8 Drawing Sheets

(51) Int. Cl.
*F04D 17/16* (2006.01)
*F04D 25/06* (2006.01)
*G01R 31/34* (2006.01)
*G01R 19/165* (2006.01)
*F04D 19/04* (2006.01)

(52) U.S. Cl.
CPC ........... *F04D 19/042* (2013.01); *F04D 25/06* (2013.01); *G01R 19/16533* (2013.01); *G01R 31/343* (2013.01)

(58) Field of Classification Search
CPC ...... F04B 39/0292; F04B 39/08; F04B 39/10; F04B 39/1073; F04B 39/12; F04B 39/121; F04B 43/0081; F04B 43/073; F04B 43/0736; F04B 47/026; F04B 47/028; F04B 49/025; F04B 49/04; F04B 49/225; F04B 53/1082; F04B 53/14; F04B 53/144; F04B 53/16; F04B 5/02; F04B 7/0076; F04B 7/02; F04D 15/0088; F04D 13/086; F04D 13/12; F04D 15/0005; F04D 15/0227; F04D 27/001; F04D 13/068; F04D 13/14; F04D 15/0272; F04D 19/04; F04D 19/042; F04D 1/06; F04D 27/009; F04D 27/02; F04D 29/668; F04D 29/669; F04D 5/002
USPC ......................................................... 73/168
See application file for complete search history.

DEPOSITION SUBSTANCE MONITORING DEVICE AND VACUUM PUMP

BACKGROUND OF THE INVENTION

1. Technical Field

The present invention relates to a deposition substance monitoring device and a vacuum pump.

2. Background Art

In an etching process for semiconductor and liquid crystal, there are, as a result of adherence and deposition of a reaction product in a pump, problems that damage is caused due to contact between a pump rotor and the deposition substance and that the pump cannot be restarted after device maintenance, for example.

When the product is deposited in the pump, an exhaust path is partially closed, and for this reason, a pressure locally increases. Thus, even under the same conditions for a pump suction port pressure and a gas flow rate, a motor load increases, and therefore, a deposition status of the product can be estimated based on a change in a motor current value.

However, many process steps each set as a combination of process gas and a processing time are provided in a manufacturing process with multiple processes, and the process is performed in such a manner that the process steps are repeated while being switched. Thus, a present motor current value itself changes in a short amount of time. Even during the process under the same conditions, the current value changes with a certain range, and therefore, it is difficult to set a threshold for a change amount of the present motor current value.

For these reasons, a method as in a technique described in Patent Literature 1 (WO 2011/145444) has been proposed as the method for accurately detecting the deposition status of the product. In this detection method, a health check mode for constantly setting the flow rate and type of gas flowing in a pump is provided, and a change amount of a present motor current value detected in such a mode is used.

However, for providing such a health check mode, there are a burden due to installation of a gas supply device for measurement and a burden due to, e.g., addition or modification of a device operation mode. This leads to a problem of increasing in cost.

SUMMARY OF THE INVENTION

A deposition substance monitoring device of a vacuum pump for rotatably driving a rotor by a motor to exhaust gas, comprises: a state determination section configured to determine whether or not the vacuum pump is in a predetermined exhaust state; and a deposition amount determination section configured to receive a deposition amount indicator for an amount of a deposition substance in the pump to determine as excessive deposition when the deposition amount indicator in the predetermined exhaust state is equal to or greater than an acceptable deposition threshold.

The predetermined exhaust state is any one of a gas supply state in which gas flows into the vacuum pump and a gas non-supply state in which no gas flows into the vacuum pump.

Any one of a motor current value of the motor and an opening degree of a valve provided on a suction port side of the vacuum pump is used as the deposition amount indicator. The state determination section determines the gas supply state and the gas non-supply state based on any one of the motor current value and the opening degree of the valve.

A deposition substance monitoring device of a vacuum pump for rotatably driving a rotor by a motor to exhaust gas, comprises: an acquiring section configured to acquire a first motor current value in a predetermined gas supply state in which gas flows into the vacuum pump and a second motor current value in a gas non-supply state right before or after the predetermined gas supply state; and a determination section configured to determine that a deposition amount of a deposition substance in the vacuum pump is excessive when a difference between the first motor current value and the second motor current value is equal to or greater than a predetermined threshold.

A vacuum pump comprises: a rotor; a motor configured to rotatably drive the rotor; and the deposition substance monitoring device.

According to the present invention, a change in the deposition amount can be detected with high accuracy, and it can be more accurately determined whether or not the deposition amount is excessive.

DETAILED DESCRIPTION OF THE EXEMPLARY EMBODIMENTS

Hereinafter, embodiments of the present invention will be described with reference to the drawings.

First Embodiment

Figure 1:
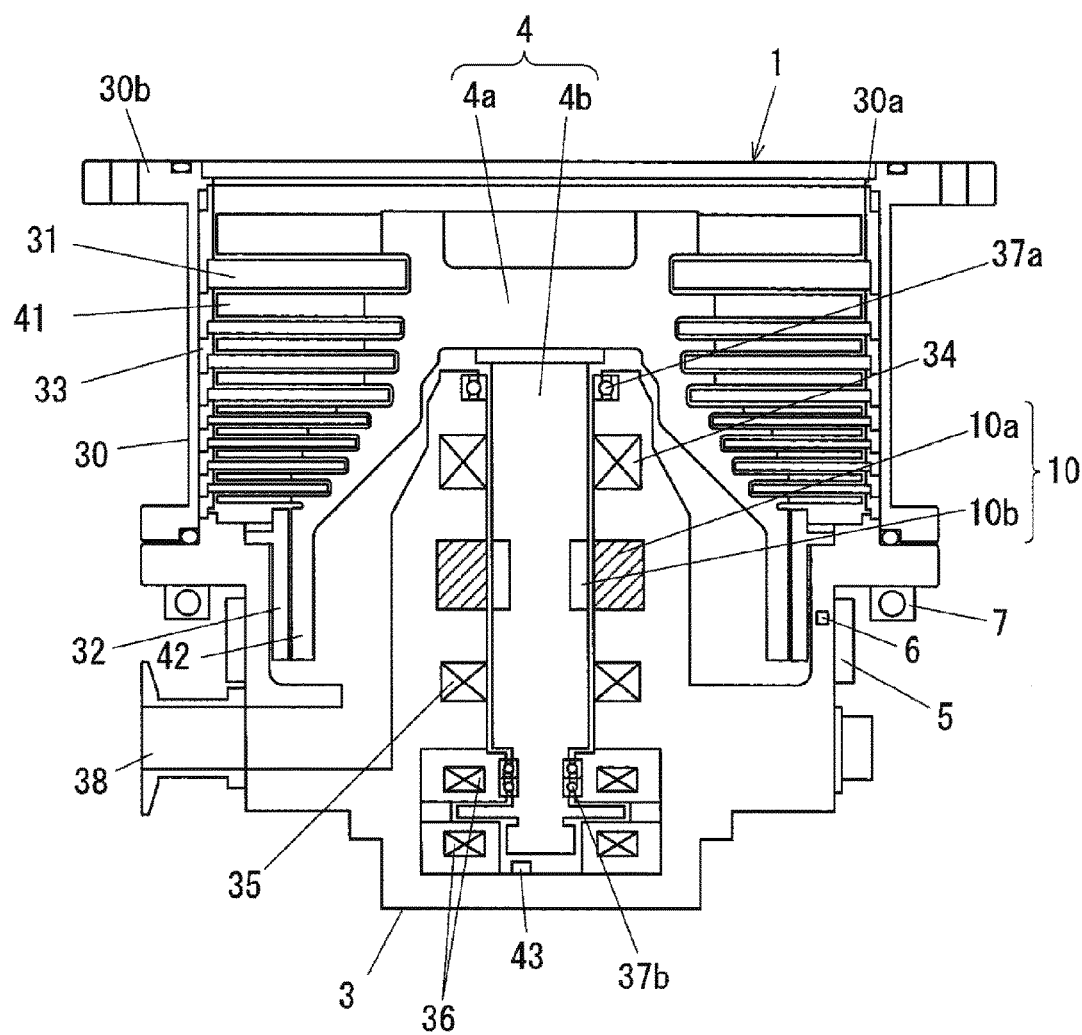
FIG. 1 is a cross-sectional view of an outline configuration of a pump main body 1 of a turbo-molecular pump.

FIG. 1 is a view of one embodiment of the present invention, and is a cross-sectional view of an outline configuration of a pump main body 1 of a turbo-molecular pump. The pump main body 1 is controlled by a control unit 2 illustrated in FIG. 2.

The pump main body 1 includes a turbo pump stage having rotor blades 41 and stationary blades 31, and a screw groove pump stage having a cylindrical portion 42 and a stator 32. In the screw groove pump stage, a screw groove is formed at the stator 32 or the cylindrical portion 42. The rotor blades 41 and the cylindrical portion 42 are formed at a pump rotor 4a. The pump rotor 4a is fastened to a shaft 4b. The pump rotor 4a and the shaft 4b form a rotor unit 4.

The stationary blades 31 and the rotor blades 41 are alternately arranged in an axial direction. Each stationary blade 31 is placed on a base 3 with a spacer ring 33 being interposed therebetween. When a pump case 30 is bolted to the base 3, the stationary blades 31 are positioned with a stack of the spacer rings 33 being sandwiched between the base 3 and a locking portion 30a of the pump case 30.

The shaft 4b is supported by magnetic bearings 34, 35, 36 provided at the base 3 in a non-contact manner. Although not specifically shown in the figure, each of the magnetic bearings 34 to 36 includes an electromagnet and a displacement sensor. The displacement sensor is configured to detect a levitation position of the shaft 4b. The rotation speed (the rotation speed per second) of the shaft 4b is detected by a rotation sensor 43.

The shaft 4b is rotatably driven by a motor 10. The motor 10 includes a motor stator 10a provided at the base 3, and a motor rotor 10b provided at the shaft 4b. When the magnetic bearings are not in operation, the shaft 4b is supported by emergency mechanical bearings 37a, 37b. When the rotor unit 4 is rotated at high speed by the motor 10, gas on a pump suction port side is sequentially exhausted by the turbo pump stage (the rotor blades 41, the stationary blades 31) and the screw groove pump stage (the cylindrical portion 42, the stator 32), and then, is discharged through an exhaust port 38.

The base 3 is provided with a heater 5 and a cooling device 7, these components being configured to adjust the temperature of the stator 32. In an example illustrated in FIG. 1, a cooling block provided with a flow path through which refrigerant circulates is provided as the cooling device 7. Although not shown in the figure, an electromagnetic valve configured to control ON/OFF of refrigerant inflow is provided at the refrigerant flow path of the cooling device 7. The base 3 is further provided with a base temperature sensor 6. Note that in the example illustrated in FIG. 1, the base temperature sensor 6 is provided at the base 3, but may be provided at the stator 32.

Figure 2:
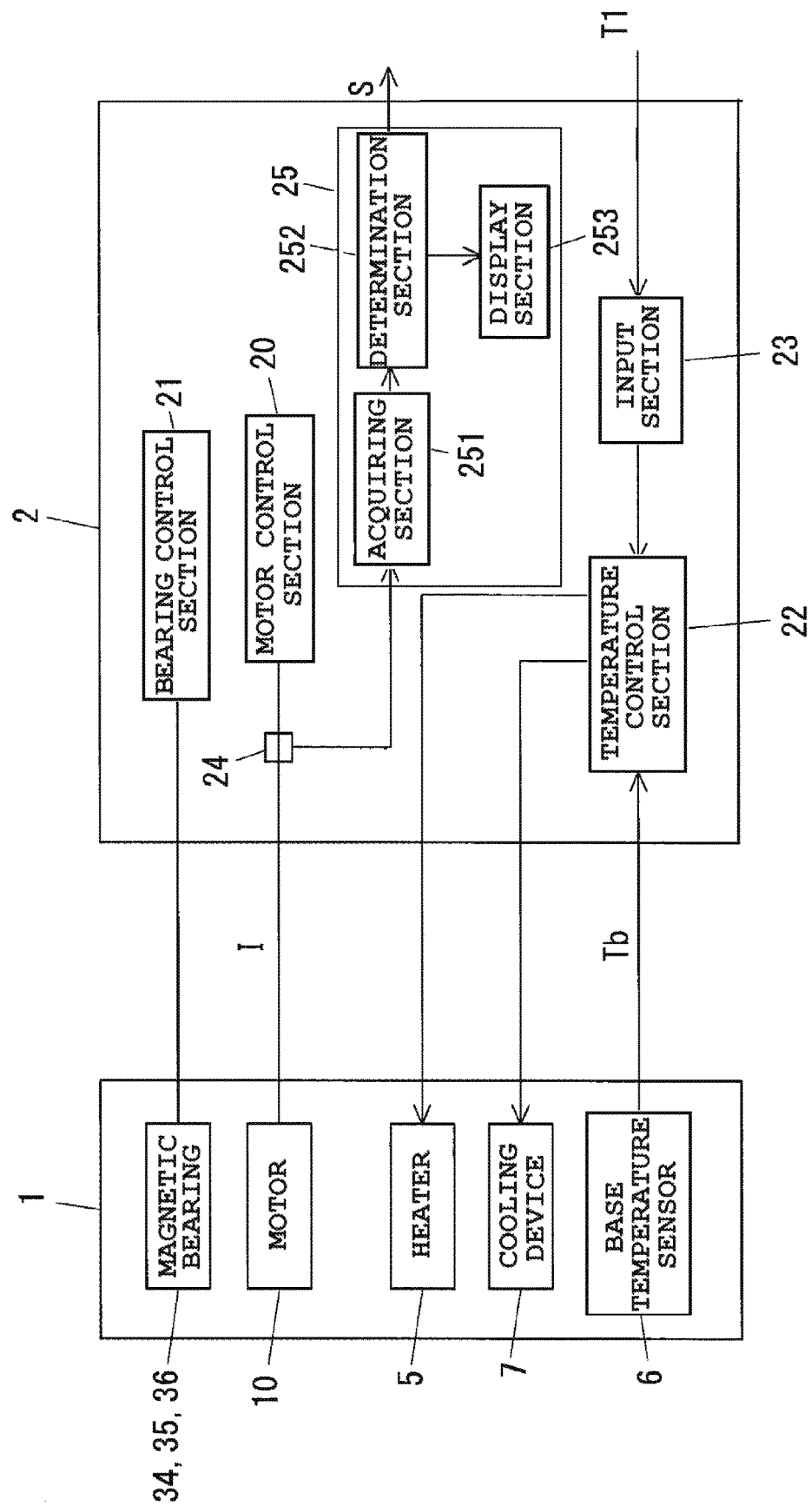
FIG. 2 is a block diagram for describing an example of a control unit 2.

FIG. 2 is a block diagram for describing an example of the control unit 2. The pump main body 1 is driven and controlled by the control unit 2. As described above, the pump main body 1 is provided with the magnetic bearings 34 to 36, the motor 10, the heater 5 and the cooling device 7 for temperature adjustment, and the base temperature sensor 6. The heater 5, the cooling device 7, and the base temperature sensor 6 are connected to a temperature control section 22 provided at the control unit 2. The temperature control section 22 is configured to control heating by the heater 5 and cooling by the cooling device 7 such that a base temperature detected by the base temperature sensor 6 reaches a predetermined target temperature T1. The predetermined target temperature T1 is input to the temperature control section 22 via an input section 23.

In addition to the temperature control section 22 and the input section 23 as described above, the control unit 2 includes a motor control section 20 configured to control the motor 10, a bearing control section 21 configured to control the magnetic bearings 34 to 36, a current detection section 24 configured to detect a motor current value, and a deposition substance monitoring section 25 configured to monitor a product deposition status based on the motor current value. The deposition substance monitoring section 25 includes an acquiring section 251, a determination section 252, and a display section 253.

In the present embodiment, the magnitude of the motor current value detected by the current detection section 24 is used as an indicator for the product deposition status. Then, the determination section 252 determines whether or not the motor current value exceeds a predetermined threshold. When it is determined as exceeding the threshold, the determination section 252 causes the display section 253 to display a warning, and outputs a warning signal S.

Next, a deposition substance monitoring method will be described. When a product is deposited in the pump, an exhaust path is partially closed, and for this reason, a pressure locally increases. In the case of the turbo-molecular pump illustrated in FIG. 1, the product tends to be deposited in the exhaust path and the stator 32 on a pump base side, and a pressure on a pump back-pressure side increases. Thus, even under the same conditions for a pump suction port pressure and a gas flow rate, a rotor unit load increases. As a result, the motor current value increases. Even when the product adheres to the rotor unit itself, the motor current value also increases. Thus, the product deposition status can be estimated based on a change in the motor current value.

Many process steps each set as a combination of process gas and a processing time are provided in a present manufacturing process, and the process is performed in such a manner that the process steps are repeated while being switched. Thus, the motor current value changes in a short amount of time. For this reason, when the motor current value is used as the deposition amount indicator and it is, based on the magnitude of the motor current value increasing according to a deposition amount, determined whether or not the deposition substance reaches equal to or greater than an acceptable amount, the motor current value under the same pump use conditions needs to be sampled.

Figure 3:
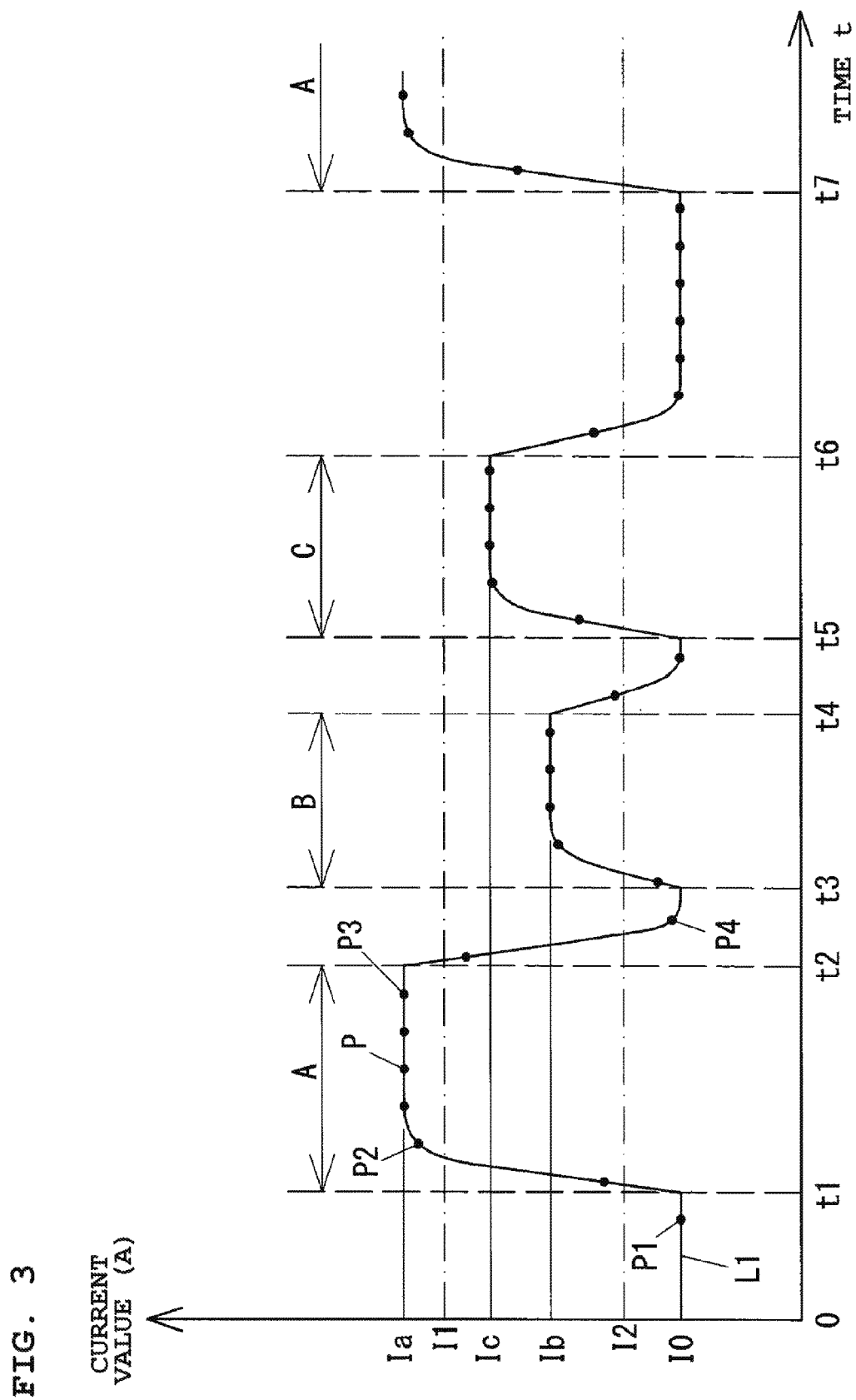
FIG. 3 is a graph of an example of a temporal change in a rotor current value.

FIG. 3 is a graph of an example of a temporal change in the motor current value when multiple processes are performed. A curve L1 represents the motor current value. Note that multiple black circles shown on the curve L1 each represent sampling data. In the example shown in FIG. 3, three processes indicated by reference characters A, B, C are performed per processing, and such processing is repeatedly executed.

These processes are different from each other in the type of gas, a processing pressure, and a processing time, and therefore, are different from each other in a pump load and the motor current value detected by the current detection section 24. Although not shown in FIG. 2, a pressure adjustment valve whose opening degree is adjustable is provided between the pump main body 1 and a process chamber, and in each process, the opening degree of the pressure adjustment valve is adjusted such that the internal pressure of the process chamber reaches the processing pressure. In the example shown in FIG. 3, the motor current value in the process A is Ia, the motor current value in the process B is Ib, the motor current value in the process C is Ic, and Ia>Ic>Ib is satisfied.

Processing gas inflow is stopped before and after each process, and the opening degree of the pressure adjustment valve is increased such that the internal pressure of the process chamber temporarily decreases. In FIG. 3, processing gas inflow is stopped during periods between t2 and t3, t4 and t5, t6 and t7, and the valve opening degree increases. Thus, during these periods, the motor current value becomes lower than Ia to Ic. When the vacuum pump is used for a long period of time in such a process, the product deposition amount increases as described above, and accordingly, the motor current value increases. Note that such a current change in a short period of time is extremely small as shown in FIG. 3. Particularly for a period in which not much time is elapsed after the start of the processing and the deposition amount is taken as substantially zero, the change in the motor current value may be taken as substantially zero.

(Method for Determining Pump Use Conditions)

As shown in FIG. 3, the motor current value varies according to the process, and greatly varies between a period during the process and a period not during the process. For example, right after the start of the processing after pump maintenance, the motor current values Ia, Ib, Ic providing no influence on product deposition are detected in the process A, the process B, and the process C. A time for which each motor current value Ia, Ib, Ic is continuously detected substantially corresponds to the processing time (i.e., a period for which processing gas is supplied) in each process. A period (i.e., a period for which no processing gas is supplied) for which the current value greatly decreases is present between adjacent ones of the processes A, B, and C.

Figure 4:
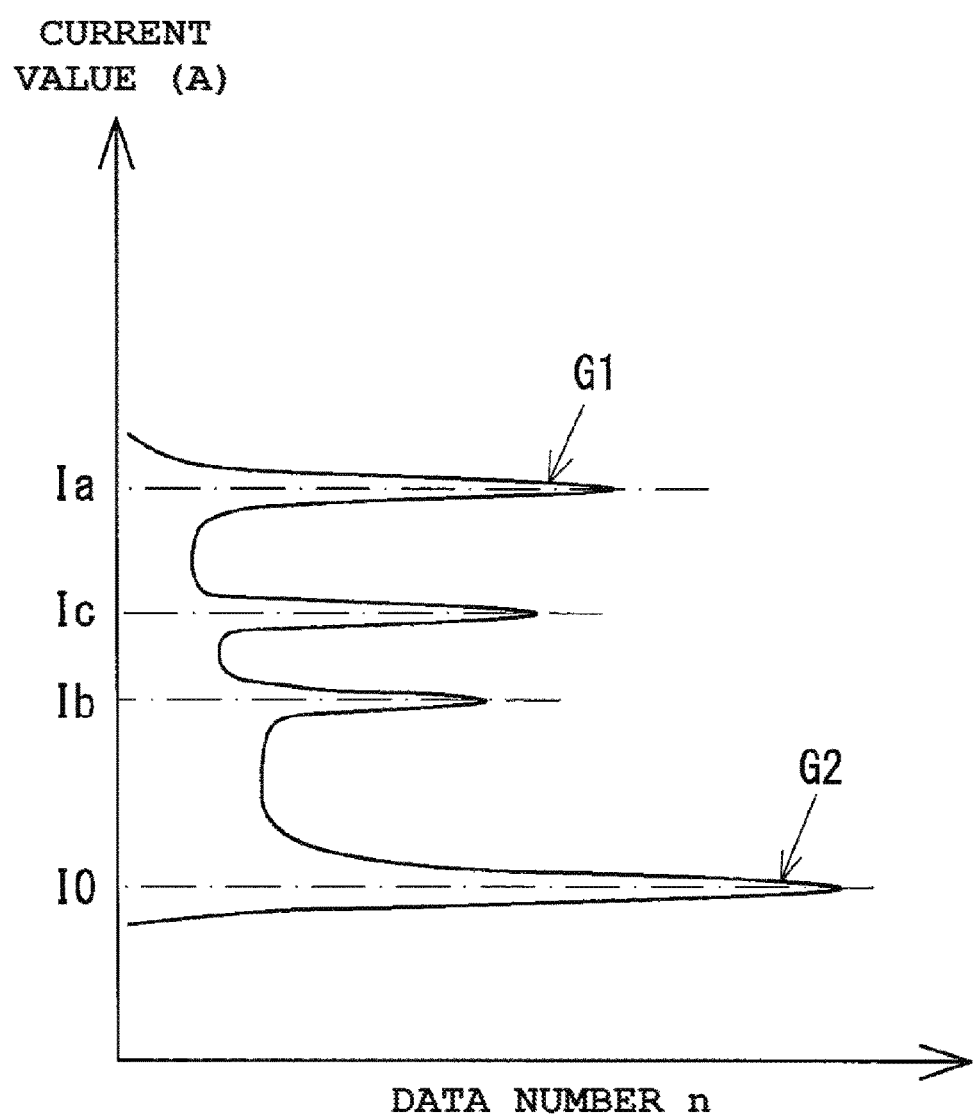
FIG. 4 is a graph of distribution of sampling data.

As seen from distribution of many motor current values sampled for an optional certain period (e.g., a period longer than a period from a time point t1 to a time point t7 in FIG. 3), data points are concentrated in the vicinity of the current values Ia, Ib, Ic, I0 as shown in FIG. 4. It can be assumed that the greatest current value data group G1 is a data group sampled during the process A and that the smallest current value data group G2 is a data group sampled when there is no gas inflow. That is, when the voltage average of the data group G1 is calculated, such an average is substantially Ia. Moreover, when the voltage average of the data group G2 is calculated, such an average is substantially I0. Needless to say, any one of the current values at the data points of the data group G1 may be taken as the motor current value Ia as the deposition amount indicator, and any one of the current values at the data points of the data group G2 may be taken as the motor current value I0 as the deposition amount indicator.

Note that even when the voltage average is used or when various separate motor current values are used, such values will be described below as the motor current value Ia.

Figure 5:
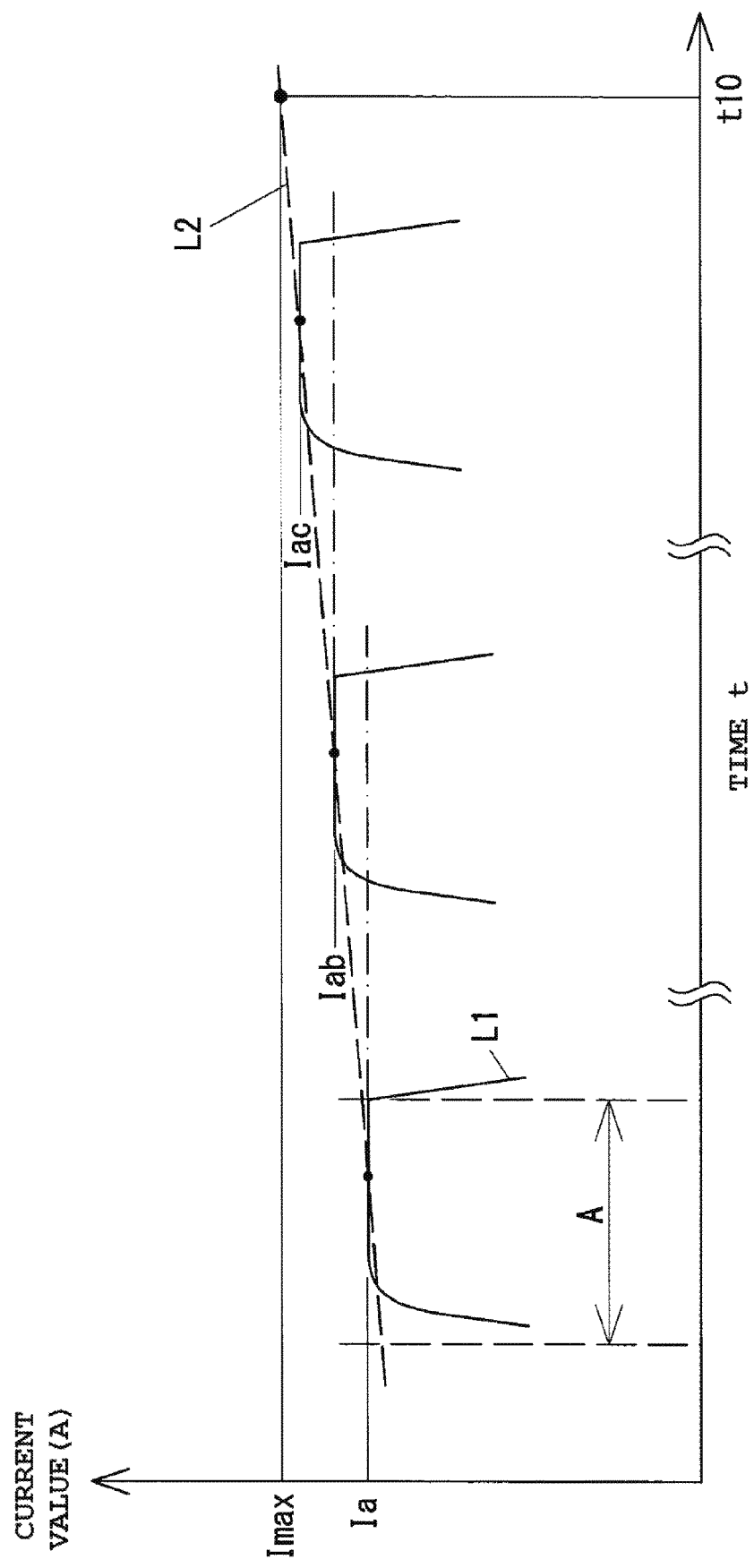
FIG. 5 is a graph for describing a temporal change in a motor current value Ia.

As described above, the motor current value Ia as the deposition amount indicator increases as a pump use time proceeds as in Iab, Iac of FIG. 5, and changes as in a curve L2. A current value Imax is a motor current value when the product deposition amount reaches the acceptable deposition amount (a time point t10). Sampling of the motor current value and extraction of the motor current value Ia in the process A are performed in the acquiring section 251 of the deposition substance monitoring section 25. The acquired motor current value Ia is input to the determination section 252, and the determination section 252 determines whether or not Ia Imax is satisfied. When the determination section 252 determines that Ia Imax is satisfied, the determination section 252 outputs the warning signal S, and causes the display section 253 to display the warning, as described above.

In description made above, the motor current value Ia is extracted from many detected motor current values for detection of the process A. However, the same can apply to the case of extracting the motor current value Ib, Ic for detection of the process B or C.

Note that data of the current value I0 of FIG. 4 may be extracted for detection of a gas non-supply state. However, the trend of increasing the motor current value in association with an increase in the deposition amount becomes more noticeable as the gas flow rate increases. Thus, the product deposition amount is most preferably determined using the motor current value in the process A with the greatest gas flow rate.

(Variation)

In the above-described embodiment, the motor current value in the process A is extracted by the method shown in FIG. 4. In a variation, a difference ΔI between a motor current value in the state in which gas flows into the pump and a motor current value in the state in which no gas flows into the pump is obtained, and it is determined as excessive product deposition when such a difference ΔI is equal to or greater than a preset difference threshold (a threshold for determining whether or not the deposition amount is excessive) ΔIth.

A current value I1 of FIG. 3 is a threshold for extracting sampling data P in the process A while gas is being supplied. On the other hand, a current value I2 is a threshold for extracting the sampling data P when no gas is supplied. When a detected motor current I satisfies I>I1, such a value is determined as the sampling data in the process A. When I<I2 is satisfied, such a value is determined as the sampling data when no gas is supplied.

In the example of FIG. 3, when an extraction range is from t=0 to t3, two pieces P1, P4 of sampling data are extracted as data satisfying I<I2, and five pieces P2 to P3 of sampling data are extracted as data satisfying I>I1. Of the extracted sampling data, a continuous data set of the data satisfying I<I2 and the data satisfying I>I1 is extracted as a data set for determination. That is, the sampling data P1, P2 is extracted as a data set, and the sampling data P3, P4 is extracted as another data set.

For the sampling data P1, P2, a value obtained by subtraction of the motor current value I0 of the sampling data P1 from the motor current value of the sampling data P2 is taken as the difference ΔI (≈Ia−I0). On the other hand, for the sampling data P3, P4, a value obtained by subtraction of the motor current value of the sampling data P4 from the motor current value Ia of the sampling data P3 is taken as the difference ΔI. When the product is deposited in the pump, the vacuum pump load increases. Note that when the flow rate of gas exhausted from the vacuum pump is low, a load increment in association with an increase in the deposition amount is extremely small. The load increment in association with an increase in the deposition amount becomes greater as the gas flow rate increases. That is, the difference ΔI increases as the deposition amount increases. The acquiring section 251 calculates the difference ΔI based on the acquired sampling data. The difference ΔI is compared with the difference threshold ΔIth in the determination section 252. When ΔI≥ΔIth is satisfied, it is determined that the product is excessively deposited.

Second Embodiment

Figure 6:
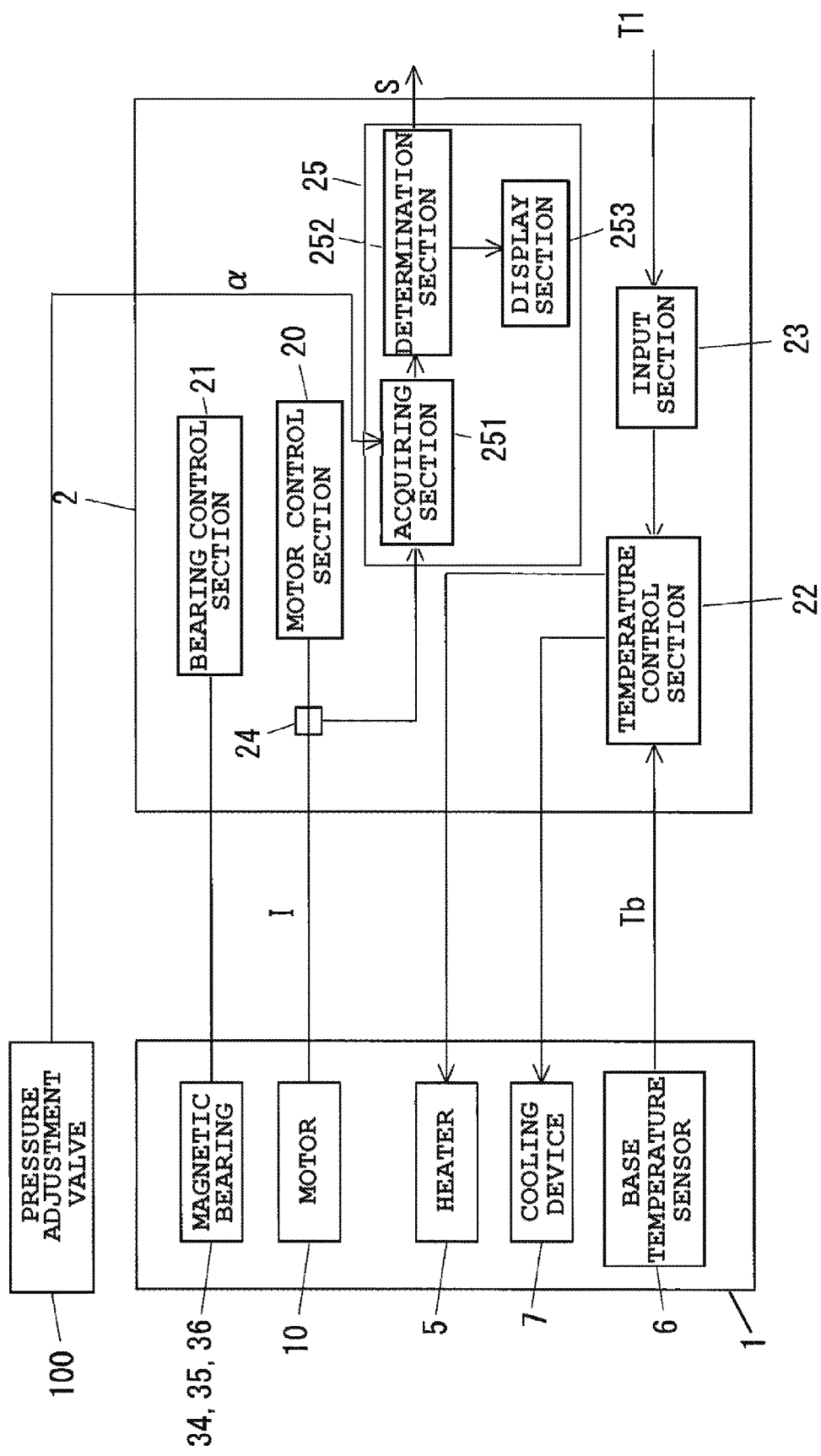
FIG. 6 is a block diagram for describing a second embodiment.

FIG. 6 is a block diagram for describing a second embodiment. A pump main body 1 is, at a suction port flange 30b (see FIG. 1) thereof, provided with a pressure adjustment valve 100 whose conductance is variable by opening degree adjustment. The pump main body 1 is attached to, e.g., a chamber of an etching device (not shown) via the pressure adjustment valve 100. A chamber pressure is controlled by adjustment of gas flowing into the chamber and the opening degree α of the pressure adjustment valve 100. An acquiring section 251 of a deposition substance monitoring section 25 acquires the opening degree α of the pressure adjustment valve 100 in addition to a motor current value. Other configurations are similar to those illustrated in FIG. 2.

Figure 7A:
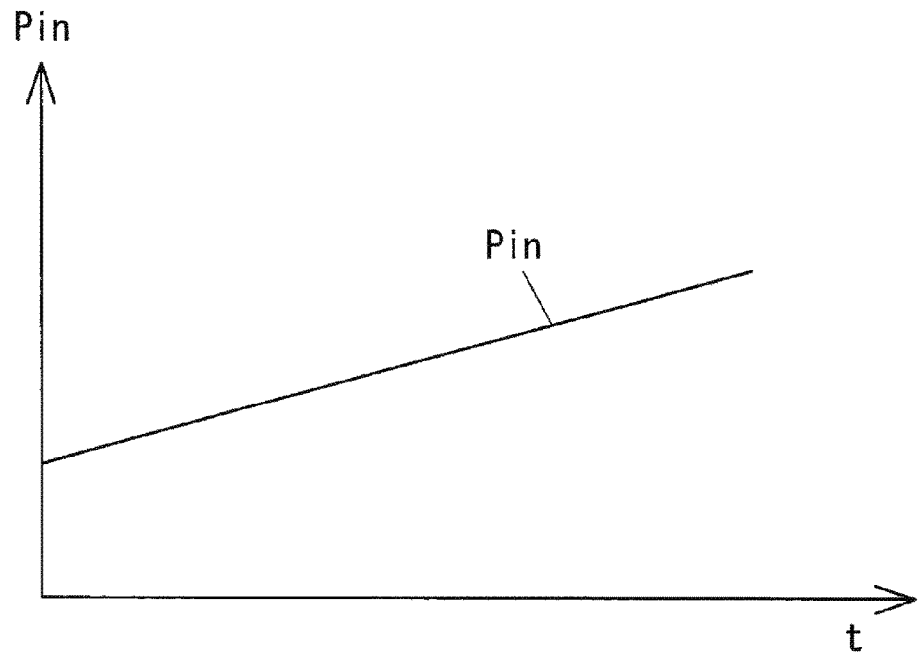
FIGS. 7A and 7B are graphs of a temporal change in a pump suction port pressure Pin, a chamber pressure Pc, and a valve opening degree α due to product deposition.
Figure 7B:
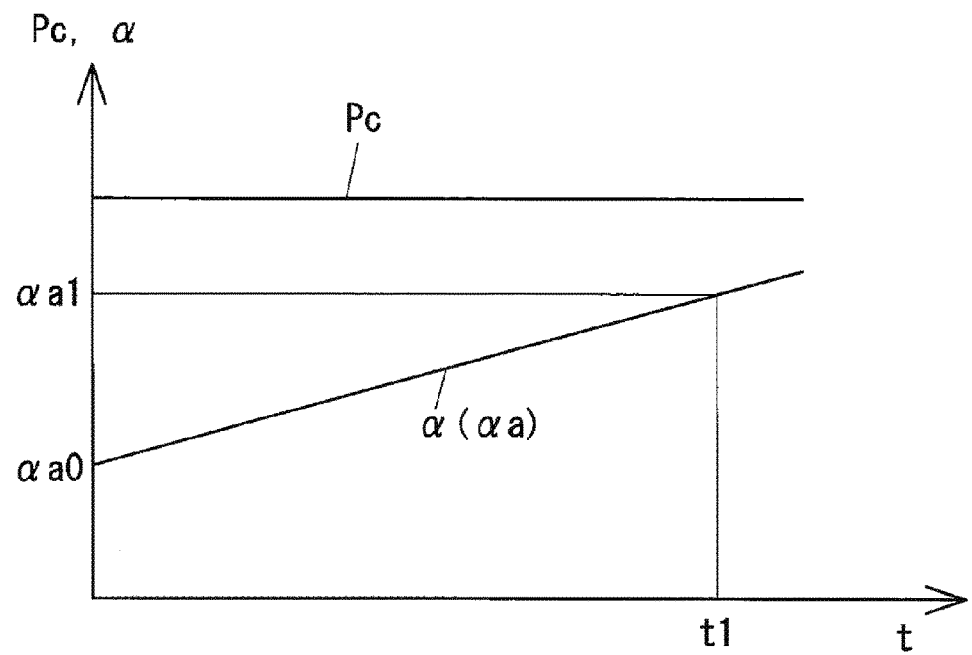

FIGS. 7A and 7B show a temporal change in a pump suction port pressure Pin, a chamber pressure Pc, the valve opening degree α due to product deposition. That is, FIGS. 7A and 7B show the pump suction port pressure Pin, the chamber pressure Pc, the valve opening degree α in a process A shown in FIG. 3 in the same pump operation state, for example. A product deposition amount increases as a time t proceeds, and accordingly, the pump suction port pressure Pin gradually increases.

Meanwhile, the chamber pressure Pc is held at a pressure required for the process A by adjustment of the valve opening degree α. The pump suction port pressure Pin gradually increases as shown in FIG. 7A. Thus, the valve opening degree α is gradually increased according to an increase in the pump suction port pressure Pin such that the chamber pressure Pc is held at a predetermined pressure. A time point t1 is a time point at which the product deposition amount reaches an acceptable upper deposition amount limit, and the opening degree at this point is αa1.

As described above, the opening degree α of the pressure adjustment valve 100 changes sensitive to a change in the deposition amount. Thus, in the present embodiment, the opening degree α is used as a deposition amount indicator, and the timing at which the deposition amount exceeds the acceptable upper deposition amount limit is detected. When the opening degree α input from the pressure adjustment valve 100 exceeds α1 with which the deposition amount reaches the acceptable upper deposition amount limit, a determination section 252 causes a display section 253 to display a warning, and outputs a warning signal S.

Figure 8:
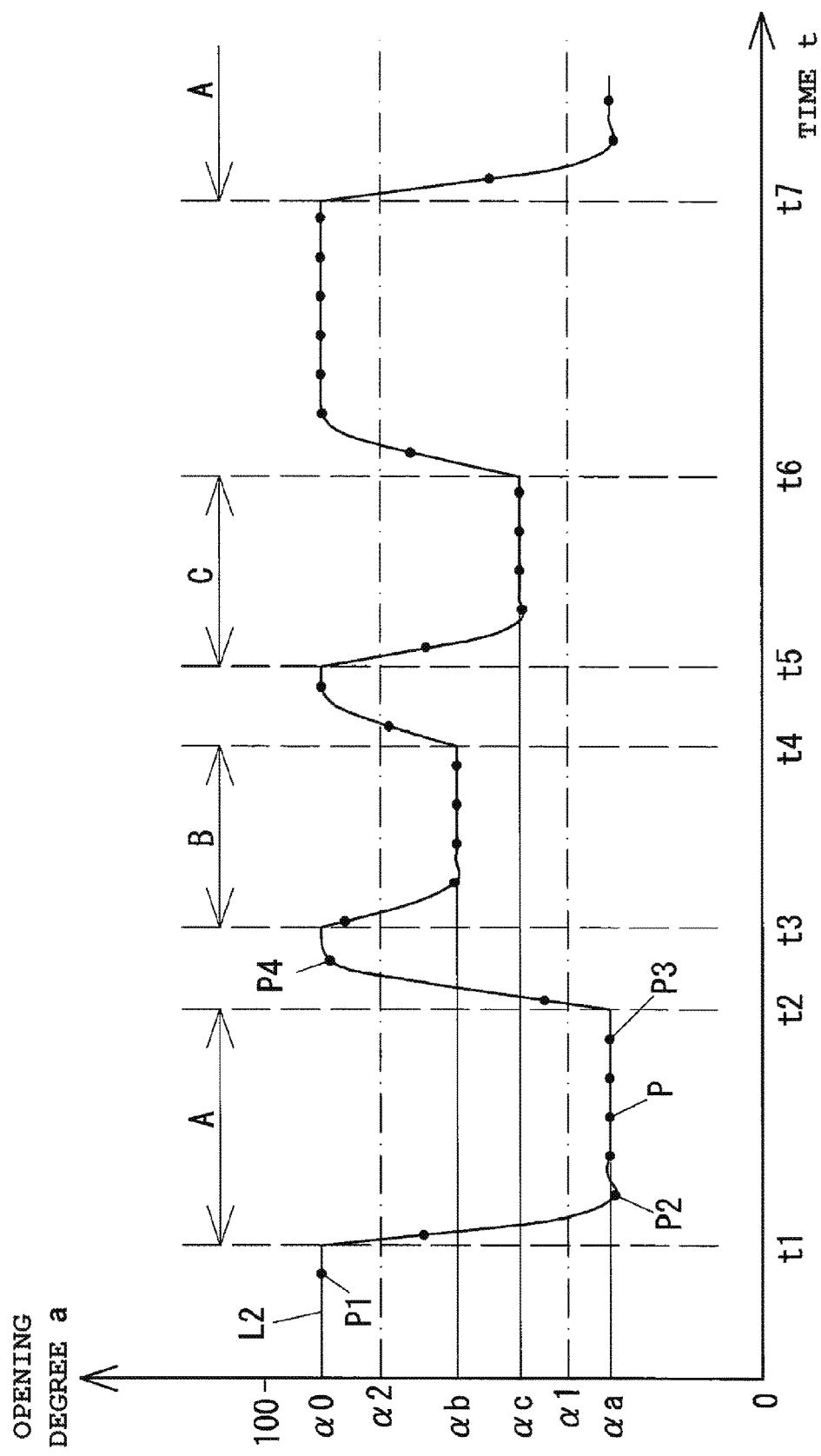
FIG. 8 is a graph of a change in the opening degree of a pressure adjustment valve in processes A, B, and C.

When three types of processes (A, B, C) are performed as in FIG. 3 of the first embodiment, the opening degree α of the pressure adjustment valve 100 changes as in FIG. 8. FIG. 8 shows the change in the opening degree of the pressure adjustment valve 100 when the processes A, B, and C shown in FIG. 3 are performed. Before the start of the process A (t<t1), an opening degree α0 is controlled to an opening degree of 100% or an opening degree close to 100% such that the chamber pressure is sufficiently low. In each of the processes A, B, and C, the opening degree is controlled to αa, αb, αc.

When the deposition amount indicator is the opening degree α, determination on whether or not the sampled opening degree α is αa, αb, αc, α1 can be made by reference to distribution shown in FIG. 4 as in the case of using the motor current value as the indicator in the first embodiment. For example, in the case of extracting the opening degree αa in the process A to monitor a change in such an opening degree, the display section 253 displays the warning and the warning signal S is output when the opening degree αa reaches equal to or higher than the opening degree αa1 shown in FIGS. 7A and 7B.

In the case of the second embodiment, a difference Δα between the opening degree αa in the state in which gas flows into a pump and the opening degree α0 in the state in which no gas flows into the pump may be obtained by an approach similar to that of the case of the above-described variation. When such a difference Δα reaches equal to or greater than a preset difference threshold (a threshold for determining whether or not the deposition amount is excessive) Δαth, it may be determined that a product is excessively deposited.

The opening degree α1 of FIG. 8 is a threshold for extracting sampling data P in the process A. When the measured opening degree α satisfies α<α1, it is determined as the sampling data in the process A. Moreover, an opening degree α2 is a threshold for extracting the sampling data P for the opening degree α0 (i.e., the case where no gas is supplied). When the measured opening degree α satisfies α>α2, it is determined as the sampling data for the opening degree α0.

Note that the opening degree α may be used when it is determined whether or not a pump operation state in sampling of the sampling data P is the process A, and the motor current value may be used as the deposition amount indicator as in the first embodiment. In this case, for determining whether or not the product deposition amount is excessive, it is determined whether or not the motor current value is equal to or greater than a current value Imax.

Conversely, the motor current value may be used for determination on whether or not the pump operation state in sampling of the sampling data P is the process A, and the opening degree α may be used as the deposition amount indicator.

(1) As described above, in the first and second embodiments, the deposition substance monitoring section 25 includes the acquiring section 251 as a state determination section configured to determine whether or not an exhaust state of the pump main body 1 is a predetermined exhaust state, i.e., determine whether the exhaust state is in the process A, the process B, the process C, or the state in which there is almost no gas flow as shown in FIG. 3, and the determination section 252 configured to receive the motor current value Ia as the deposition amount indicator for the amount of the deposition substance in the pump to determine as excessive deposition when the deposition amount indicator Ia in the process A in the predetermined exhaust state is equal to or greater than the acceptable deposition threshold Imax.

As described above, the deposition amount indicator Ia is the motor current value measured in the process A in the same predetermined exhaust state. Thus, such a motor current value Ia is acquired for a medium to long period of time so that, e.g., influence of variation in a present motor current value in a short period of time can be reduced. As a result, the change in the motor current value due to product deposition can be measured with higher accuracy, and it can be more accurately determined whether or not the deposition amount is excessive.

(2) Note that the predetermined exhaust state may be not only a gas supply state in which gas flows into the vacuum pump as in the above-described processes A, B, and C, but also a gas non-supply state in which no gas flows into the vacuum pump as in an inter-process period.

(3) Any one of the motor current value I and the opening degree α of the pressure adjustment valve 100 is used as the deposition amount indicator, and the acquiring section 251 functioning as the state determination section determines the gas supply state and the gas non-supply state based on any one of the motor current value I and the opening degree α of the pressure adjustment valve 100.

(4) As described in the variation, the deposition substance monitoring section 25 includes the acquiring section 251 configured to acquire the first motor current value Ia in a predetermined gas supply state (e.g., the process A) in which gas flows into the pump main body 1 and the second motor current value I0 in the gas non-supply state right before or after the gas supply state, and the determination section 252 configured to determine that the deposition amount of the deposition substance is excessive when the difference ΔI between the first motor current value Ia and the second motor current value I0 is equal to or greater than the predetermined threshold ΔIth.

As described above, for the predetermined gas supply state (the process A), it is, using the difference ΔI in the motor current value between the predetermined gas supply state and the gas non-supply state right before or after the predetermined gas supply state, determined whether or not the deposition amount is excessive. Thus, a change in the difference ΔI due to an increase in the deposition amount in the same state can be detected with higher accuracy. As a result, it can be more accurately determined whether or not the deposition amount is excessive.

Note that a difference between the motor current value Ia and a default value Ia0 of the motor current value Ia may be used as the deposition amount indicator for the amount of the deposition substance in the pump, instead of using the above-described difference ΔI. The default value Ia0 of the motor current value Ia as described herein is a motor current value when the deposition amount upon the start of use of the pump is zero. Alternatively, a difference between a valve opening degree αa and a default value αa0 of the valve opening degree αa may be used as the deposition amount indicator. The default value αa0 is, as shown in FIG. 7B, a valve opening degree in the process A when the deposition amount is zero.

Various embodiments and variations have been described above, but the present invention is not limited to the contents of these embodiments and variations. For example, the magnetic bearing type turbo-molecular pump has been described above as an example of the vacuum pump in the embodiments, but the vacuum pump is not necessarily of the magnetic bearing type. Further, the present invention is also applicable to other vacuum pumps than the turbo-molecular pump. Other aspects conceivable within the scope of the technical idea of the present invention are also included in the scope of the present invention.

What is claimed is:

1. A deposition substance monitoring device of a vacuum pump for rotatably driving a rotor by a motor to exhaust gas, comprising:
    a state determination section configured to determine each particular exhaust state, among a plurality of different exhaust states, the vacuum pump is in; and
    a deposition amount determination section configured to receive a deposition amount indicator for an amount of a deposition substance in the pump to determine as excessive deposition when the deposition amount indicator in the determined each particular exhaust state is equal to or greater than an acceptable deposition threshold.

2. The deposition substance monitoring device according to claim 1, wherein
    the plurality of different exhaust states include a gas supply state in which gas flows into the vacuum pump and a gas non-supply state in which no gas flows into the vacuum pump.

3. A deposition substance monitoring device of a vacuum pump for rotatably driving a rotor by a motor to exhaust gas, comprising:
    a state determination section configured to determine whether or not the vacuum pump is in a predetermined exhaust state; and
    a deposition amount determination section configured to receive a deposition amount indicator for an amount of a deposition substance in the pump to determine as excessive deposition when the deposition amount indicator in the predetermined exhaust state is equal to or greater than an acceptable deposition threshold,
    wherein
    the predetermined exhaust state is any one of a gas supply state in which gas flows into the vacuum pump and a gas non-supply state in which no gas flows into the vacuum pump,
    any one of a motor current value of the motor and an opening degree of a valve provided on a suction port side of the vacuum pump is used as the deposition amount indicator, and
    the state determination section determines the gas supply state and the gas non-supply state based on any one of the motor current value and the opening degree of the valve.

4. A deposition substance monitoring device of a vacuum pump for rotatably driving a rotor by a motor to exhaust gas, comprising:
    an acquiring section configured to acquire a first motor current value in a predetermined gas supply state in which gas flows into the vacuum pump and a second motor current value in a gas non-supply state right before or after the predetermined gas supply state; and
    a determination section configured to determine that a deposition amount of a deposition substance in the vacuum pump is excessive when a difference between the first motor current value and the second motor current value is equal to or greater than a predetermined threshold.

5. A vacuum pump comprising:
a rotor;
a motor configured to rotatably drive the rotor; and
the deposition substance monitoring device according to claim 1.

6. A vacuum pump comprising:
a rotor;
a motor configured to rotatably drive the rotor; and
the deposition substance monitoring device according to claim 4.

* * * * *